(12) United States Patent
Yang

(10) Patent No.: US 6,440,757 B1
(45) Date of Patent: Aug. 27, 2002

(54) MICROELECTRONIC FABRICATION DIE ELECTRICAL PROBE APPARATUS ELECTRICAL TEST METHOD PROVIDING ENHANCED MICROELECTRONIC FABRICATION DIE ELECTRICAL TEST ACCURACY AND EFFICIENCY

(75) Inventor: Feng-Yi Yang, Taipei (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/942,395

(22) Filed: Aug. 29, 2001

(51) Int. Cl.[7] ................................................ H01L 21/66
(52) U.S. Cl. ............................................ 438/4; 438/17
(58) Field of Search ................................. 438/4, 10, 11, 438/12, 14, 17, 18

(56) References Cited

U.S. PATENT DOCUMENTS

| | | | |
|---|---|---|---|
| 5,585,737 A | 12/1996 | Shibata | 324/754 |
| 5,838,951 A | 11/1998 | Song | 395/500 |
| 6,043,101 A | 3/2000 | Stubblefield et al. | 438/17 |
| 6,128,403 A | 10/2000 | Ozaki | 382/145 |
| 6,194,738 B1 * | 2/2001 | Debenham et al. | 438/14 |
| 6,265,232 B1 * | 7/2001 | Simmons | 438/4 |
| 6,274,395 B1 * | 8/2001 | Weber | 438/14 |

FOREIGN PATENT DOCUMENTS

JP              54-57968    * 5/1979

* cited by examiner

*Primary Examiner*—Chandra Chaudhari
(74) *Attorney, Agent, or Firm*—Tung & Associates

(57) ABSTRACT

Within a method for electrical test testing a series of microelectronic fabrication die fabricated within a microelectronic fabrication substrate, there is first electrical probe tested the series of microelectronic fabrication die to determine at least one sub-series of electrically unacceptable microelectronic fabrication die. Each electrically unacceptable microelectronic fabrication die within the series of electrically unacceptable microelectronic fabrication die is then electrical probe retested after having repositioned an electrical probe head with respect to the electrically unacceptable microelectronic fabrication die.

15 Claims, 3 Drawing Sheets

MICROELECTRONIC FABRICATION DIE ELECTRICAL PROBE APPARATUS ELECTRICAL TEST METHOD PROVIDING ENHANCED MICROELECTRONIC FABRICATION DIE ELECTRICAL TEST ACCURACY AND EFFICIENCY

BACKGROUND OF THE INVENTION

1. Field of the Invention

The present invention relates generally to electrical probe apparatus electrical test methods for electrical test testing microelectronic fabrication die. More particularly, the present invention relates to electrical probe apparatus electrical test methods for accurately and efficiently electrically test testing microelectronic fabrication die.

2. Description of the Related Art

Microelectronic fabrications are formed from microelectronic substrates over which are formed patterned microelectronic conductor layers which are separated by microelectronic dielectric layers.

Integral to the fabrication of microelectronic fabrications, and in particular to the fabrication of semiconductor integrated circuit microelectronic fabrications, is the electrical test testing of microelectronic fabrication die. The electrical test testing of microelectronic fabrication die may occur: (1) during various stages incident to the ongoing fabrication of microelectronic fabrication substrates, as is generally understood to encompass in-line electrical test testing of microelectronic fabrication die; as well as (2) subsequent to completion of fabrication of microelectronic fabrication substrates, as is generally understood to encompass final electrical test testing of microelectronic fabrication die. Within either in-line electrical test testing of microelectronic fabrication die or final electrical test testing of microelectronic fabrication die there is typically and preferably employed an electrical probe apparatus electrical test method which provides for electrical probe apparatus electrical test testing of various microelectronic devices and/or various microelectronic circuits within a plurality of microelectronic fabrication die fabricated within a microelectronic fabrication substrate.

While in-line electrical test testing of microelectronic fabrication die and final electrical test testing of microelectronic fabrication die while employing electrical probe apparatus electrical test methods are both of considerable interest and of considerable importance to the goal of fabricating fully functional and fully reliable microelectronic fabrication die, both in-line electrical test testing of microelectronic fabrication die and final electrical test testing of microelectronic fabrication die while employing electrical probe apparatus electrical test methods are nonetheless not entirely without problems with respect to the goal of fabricating fully functional and fully reliable microelectronic fabrication die. In that regard, both in-line electrical test testing of microelectronic fabrication die and final electrical test testing of microelectronic fabrication die while employing electrical probe apparatus electrical test methods are often not entirely accurate when fabricating microelectronic fabrication die and often require a considerable expenditure of microelectronic fabrication processing resources, including but not limited to microelectronic fabrication cycle time processing resources, microelectronic fabrication tooling processing resources and microelectronic fabrication direct labor processing resources when fabricating microelectronic fabrication die. Such electrical test testing inaccuracy and considerable expenditure of microelectronic fabrication processing resources in turn increases in general microelectronic fabrication production costs when fabricating microelectronic fabrication die.

It is thus desirable in the art of microelectronic fabrication to provide electrical test methods for more accurately and efficiently electrical test testing microelectronic fabrication die fabricated within microelectronic fabrication substrates.

It is towards the foregoing object that the present invention is directed.

Various methods, systems and apparatus for electrically test testing microelectronic fabrications, such as to realize desirable results incident to electrical test testing microelectronic fabrications, have been disclosed in the art of microelectronic fabrication.

For example, Shibata, in U.S. Pat. No. 5,585,737, discloses an electrical probe apparatus electrical test method for electrical test testing within a semiconductor integrated circuit microelectronic fabrication substrate wafer a series of semiconductor integrated circuit microelectronic fabrication die fabricated within the semiconductor integrated circuit microelectronic fabrication substrate wafer while minimizing a number of times the semiconductor integrated circuit microelectronic fabrication substrate wafer must be indexed when electrical test testing the series of semiconductor integrated circuit microelectronic fabrication die within the semiconductor integrated circuit microelectronic fabrication substrate wafer. To realize the foregoing result, the electrical probe apparatus electrical test method employs within an electrical probe apparatus an electrical probe apparatus electrical test card sized and fabricated such as to electrical probe test a plurality of semiconductor integrated circuit microelectronic fabrication die index regions within the semiconductor integrated circuit microelectronic fabrication substrate wafer, where the plurality of semiconductor Integrated circuit microelectronic fabrication die index regions within the semiconductor integrated circuit microelectronic fabrication substrate wafer is formed in a bidirectional array of columns and rows of an even numbered plurality, and wherein at least one of the even numbered plurality is equal to four, and further where the plurality of semiconductor integrated circuit microelectronic fabrication die index regions within the semiconductor integrated circuit microelectronic fabrication substrate wafer is arranged such as to minimize non-contact of the electrical probe apparatus electrical test card with the series of semiconductor integrated circuit microelectronic fabrication die within the semiconductor integrated circuit microelectronic fabrication substrate wafer.

In addition, Song, in U.S. Pat. No. 5,838,951, discloses an electrical test data manipulation method for more effectively utilizing electrical test data for a series of semiconductor integrated circuit microelectronic fabrication die fabricated within a semiconductor integrated circuit microelectronic fabrication substrate wafer such as to in turn provide for enhanced manufacturing efficiency when die bonding within a series of die bond packages the series of semiconductor integrated circuit microelectronic fabrication die when parted from the semiconductor integrated circuit microelectronic fabrication substrate wafer. To realize the foregoing result, the electrical test data manipulation method provides for preparation from a series of electrical test data obtained from the series of semiconductor integrated circuit microelectronic fabrication die within the semiconductor integrated circuit microelectronic fabrication substrate wafer a wafer map format file from which is derived a converted wafer map format file which in turn may be employed by a semiconductor integrated circuit microelectronic fabrication die bonder fabrication tool when die bonding the series of semiconductor integrated circuit microelectronic fabrication die within a series of semiconductor integrated circuit microelectronic fabrication packages.

Further, Stubblefield et al., in U.S. Pat. No. 6,043,101, discloses an electrical probe apparatus electrical test method which may be employed for efficiently reducing with respect to electrical probe apparatus electrical test testing of a series of semiconductor integrated circuit microelectronic fabrication die within a semiconductor integrated circuit microelectronic fabrication substrate wafer a quantity of false electrical failures for a sub-series of semiconductor integrated circuit microelectronic fabrication die within the series of semiconductor integrated circuit microelectronic fabrication die. To realize the foregoing result, the electrical probe apparatus electrical test method provides for an immediate retesting of an apparent electrical failed semiconductor integrated circuit microelectronic fabrication die within the sub-series of semiconductor integrated circuit microelectronic fabrication die prior to repositioning an electrical probe apparatus electrical test head within an electrical probe apparatus employed for testing the series of semiconductor integrated circuit microelectronic fabrication die.

Finally, Ozaki, in U.S. Pat. No. 6,128,403, discloses a test data system and a test data method which may be employed for more effectively utilizing test data, such as but not limited to electrical probe apparatus electrical test data, when fabricating a series of semiconductor integrated circuit microelectronic fabrication die within a semiconductor integrated circuit microelectronic fabrication substrate wafer. To realize the foregoing result, the test data system and the test data method employ a plurality of types of test data obtained at various stages in fabrication of the series of semiconductor integrated circuit microelectronic fabrication die within the semiconductor integrated circuit microelectronic fabrication substrate wafer, where the plurality of types of test data are arranged in a plurality of semiconductor integrated circuit microelectronic substrate wafer maps and where the plurality of semiconductor integrated circuit microelectronic fabrication substrate wafer maps may be linked and superimposed.

Desirable in the art of microelectronic fabrication are additional electrical test methods which may be employed for more accurately and efficiently electrical test testing microelectronic fabrication die fabricated within microelectronic fabrication substrates.

It is towards the foregoing object that the present invention is directed.

SUMMARY OF THE INVENTION

A first object of the present invention is to provide an electrical test method for electrical test testing a series of microelectronic fabrication die fabricated within a microelectronic fabrication substrate.

A second object of the present invention is to provide an electrical test method in accord with the first object of the present invention, wherein the series microelectronic fabrication die is more accurately and efficiently electrical test tested.

A third object of the present invention is to provide an electrical test method in accord with the first object of the present invention and the second object of the present invention, wherein the electrical test method is readily commercially implemented.

In accord with the objects of the present invention, there is provided by the present invention an electrical test method for electrical test testing a series of microelectronic fabrication die fabricated within a microelectronic fabrication substrate.

To practice the method of the present invention, there is first provided a microelectronic fabrication substrate having fabricated therein a series of microelectronic fabrication die. There is then electrical test tested within the microelectronic fabrication substrate the series of microelectronic fabrication die while employing an electrical probe apparatus which sequentially repositions an electrical probe head which accommodates at least one microelectronic fabrication die within the series of microelectronic fabrication die when electrical test testing each of the microelectronic fabrication die within the series of microelectronic fabrication die to thus determine from the series of microelectronic fabrication die at least one sub-series of electrically unacceptable microelectronic fabrication die. Finally, there is then electrical test retested the at least one sub-series of electrically unacceptable microelectronic fabrication die after having repositioned the electrical probe head with respect to each microelectronic fabrication die within the at least one sub-series of electrically unacceptable microelectronic fabrication die.

There is provided by the present invention an electrical test method for electrical test testing a series of microelectronic fabrication die fabricated within a microelectronic fabrication substrate, wherein the series of microelectronic fabrication die fabricated within the microelectronic fabrication substrate is more accurately and efficiently electrical test tested.

The present invention realizes the foregoing object by employing an electrical probe apparatus electrical test method which provides for: (1) an electrical probe head electrical test testing of each of a series of microelectronic fabrication die fabricated within a microelectronic fabrication substrate to determine at least one sub-series of electrically unacceptable microelectronic fabrication die within the microelectronic fabrication substrate; followed by (2) electrical test retesting of the at least one series of electrically unacceptable microelectronic fabrication die within the microelectronic fabrication substrate after having repositioned the electrical probe head with respect to each microelectronic fabrication die within the at least one sub-series of electrically unacceptable microelectronic fabrication die.

The method of the present invention is readily commercially implemented. The present invention employs apparatus and systems as are generally known in the art of microelectronic fabrication, but employed at least in part within the context of a novel methodology which provides at least in part the present invention. Since it is thus at least in part a specific methodology which provides at least in part the present invention, rather than the existence of specific apparatus and systems which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

There is provided by the present invention an electrical test method for electrical test testing a microelectronic fabrication die fabricated within a microelectronic fabrication substrate, wherein the microelectronic fabrication die fabricated within the microelectronic fabrication substrate is more accurately and efficiently tested.

The present invention realizes the foregoing object by employing an electrical probe apparatus electrical test method which provides for: (1) an electrical probe head electrical test testing of each of a series of microelectronic fabrication die fabricated within a microelectronic fabrication substrate to determine at least one sub-series of electrically unacceptable microelectronic fabrication die within the microelectronic fabrication substrate; followed by (2) electrical test retesting of the at least one sub-series of electrically unacceptable microelectronic fabrication die within the microelectronic fabrication substrate after having repositioned the electrical probe head with respect to each microelectronic fabrication die within the at least one sub-series of electrically unacceptable microelectronic fabrication die.

Although the present invention provides particular value when electrical test testing with enhanced accuracy and enhanced efficiency a series of semiconductor integrated circuit microelectronic fabrication die within a semiconductor integrated circuit microelectronic fabrication substrate wafer, the present invention may be employed for electrical test testing, with enhanced accuracy and enhanced efficiency, various series of microelectronic fabrication die fabricated within various microelectronic fabrication substrates employed within various microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Figure 1:
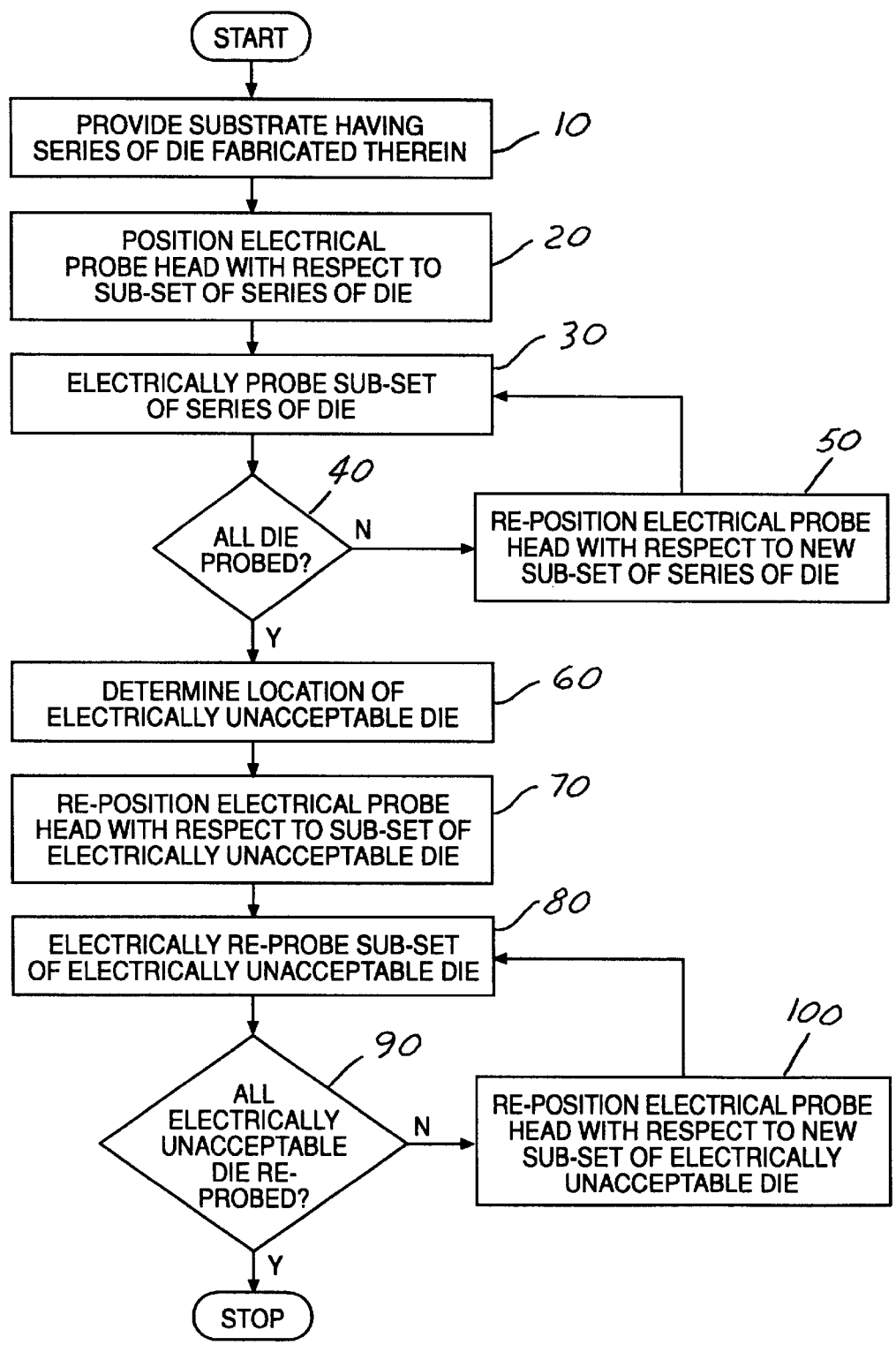
FIG. 1 shows an algorithmic flow diagram ilustrating a preferred embodiment of the method of the present invention.

Referring now to FIG. 1, there is shown a schematic algorithmic flow diagram illustrating the preferred embodiment of the method of the present invention.

Shown in FIG. 1, and in accord with the block which corresponds with reference numeral 10, there is first provided a microelectronic fabrication substrate having fabricated therein a series of microelectronic fabrication die.

Within the preferred embodiment of the present invention, and in general in accord with the disclosure above, the microelectronic fabrication substrate may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications. More preferably, and in specific in accord with the disclosure above, the present invention is more preferably employed with respect to electrical test testing a series of semiconductor integrated circuit microelectronic fabrication die fabricated within a semiconductor integrated circuit microelectronic fabrication substrate wafer.

Referring again to FIG. 1, and in accord with the block which corresponds with reference numeral 20, the microelectronic fabrication substrate having fabricated therein the series of microelectronic fabrication die is then positioned within an electrical probe apparatus wherein there is positioned with respect to a sub-set of the series of microelectronic fabrication die an electrical probe head which also comprises the electrical probe apparatus.

Within the preferred embodiment of the present invention with respect to the electrical probe apparatus and the electrical probe head, the electrical probe apparatus and the electrical probe head may be of a construction as is otherwise generally conventional in the art of microelectronic fabrication, including but not limited to a construction which provides a physical contact of the electrical probe head with the sub-set of the series of microelectronic fabrication die and a construction which provides a non-physical (i.e., inductive) contact of the electrical probe head with the sub-set of the series of microelectronic fabrication die.

Similarly, within the preferred embodiment of the present invention with respect to the sub-set of the series of microelectronic fabrication die with respect to which the electrical probe head within the electrical probe apparatus is positioned, although the sub-set of the series of microelectronic fabrication die is typically and preferably a single microelectronic fabrication die, the present invention also contemplates an electrical probe head sized and fabricated such as to accommodate a simultaneous electrical probe testing of more than one microelectronic fabrication die.

Referring again to FIG. 1, and in accord with the block which corresponds with reference numeral 30, there is then electrical probe tested while employing the electrical probe apparatus the sub-set of the series of microelectronic fabrication die. Such electrical probe testing while employing the electrical probe apparatus of the sub-set of the series of microelectronic fabrication die may be undertaken within the context of electrical test parameters as are otherwise also generally conventional in the art of electrical probe testing of microelectronic fabrication die, such electrical test parameters including but not limited to electrical opens, electrical shorts, electrical leakage currents and microelectronic device threshold voltages.

Referring again to FIG. 1, and in accord with the inquiry block which corresponds with reference numeral 40, there is then determined if each of the microelectronic fabrication die within the series of microelectronic fabrication die has been electrical probe tested.

If each of the microelectronic fabrication die within the series of microelectronic fabrication die has not been electrical probe tested, and in accord with a repetitive loop which includes the blocks which correspond with reference numeral 50, reference numeral 30 and reference numeral 40, the electrical probe head within the electrical probe apparatus is repetitively repositioned to a new sub-set of the series of microelectronic fabrication die and the new sub-sets of the series of microelectronic fabrication die are electrical probe tested until such time as all of the series of microelectronic fabrication die have been electrical probe tested.

Referring again to FIG. 3, and in accord with the block which corresponds with reference numeral 60, and as a result of electrical probe testing of each of the series of microelectronic fabrication die, there is determined a location within the microelectronic fabrication substrate of at least one sub-series of electrically unacceptable microelectronic fabrication die. In that regard, the number of sub-series of electrically unacceptable microelectronic fabrication die will typically and preferably correspond with a number of different types of electrical failure modes within the electrically unacceptable microelectronic fabrication die.

Referring again to FIG. 1, and in accord with the blocks which correspond with reference numeral 70 and reference numeral 80, there is then repositioned the electrical probe head with respect to a sub-set of the sub-series of electrically unacceptable microelectronic fabrication die and electrical probe retested the sub-set of the sub-series of electrically unacceptable microelectronic fabrication die.

Similarly, with the initial electrical probe testing of the multiple sub-sets of the series of microelectronic fabrication die in accord with the blocks which correspond with reference numerals 20, 30, 40 and 50, within the blocks which correspond with reference numerals 70 and 80 it is typical and preferred that the sub-sets of the sub-series of electrically unacceptable microelectronic fabrication die which are electrical probe retested comprise a single electrically unacceptable microelectronic fabrication die. however, the present invention also does not preclude simultaneous electrical test retesting of a sub-set of the sub-series of electrically unacceptable microelectronic fabrication die which comprises multiple electrically unacceptable microelectronic fabrication die.

Referring again to FIG. 1, and in accord with the inquiry block which corresponds with reference numeral 90, there is determined if all electrically unacceptable die within the sub-series of electrically unacceptable microelectronic fabrication die have been electrical probe retested.

If all electrically unacceptable microelectronic fabrication die within the sub-series of electrically unacceptable microelectronic fabrication die have not beer. electrical probe retested, and in accord with a repetitive loop which includes the blocks which correspond with reference numerals 100, 80 and 90, the electrical probe head is sequentially and repetitively repositioned and electrical probe tests are sequentially and repetitively undertaken until such time as all of the sub-sets of the sub-series of electrically unacceptable microelectronic fabrication die within the sub-series of electrically unacceptable microelectronic fabrication die have been electrical probe retested. At such point in time, the preferred embodiment of the method of the present invention as illustrated in conjunction with the algorithmic flow diagram of FIG. 1 is stopped.

As is understood by a person skilled in the art, and although the algorithmic flow diagram of FIG. 1 generally illustrates the present invention within the context of: (1) a first electrical probe testing of each of a series of microelectronic fabrication die fabricated within a microelectronic fabrication substrate; prior to (2) a second electrical probe retesting of each of a sub-series of electrically unacceptable microelectronic fabrication die within the series of microelectronic fabrication die fabricated within the microelectronic fabrication substrate, the present invention also contemplates than an electrically unacceptable microelectronic fabrication die within a sub-series of electrically unacceptable microelectronic fabrication substrate may be Immediately electrical probe retested after an initial electrical probe test has determined the electrically unacceptable microelectronic fabrication die to be electrically unacceptable. Within the context of the present invention however, the present invention requires that an electrical probe head within an electrical probe apparatus be repositioned with respect to each of a sub-series of electrically unacceptable microelectronic fabrication die prior to electrical probe retesting of each of the sub-series of electrically unacceptable microelectronic fabrication die. Such repositioning of the electrical probe head with respect to each of the sub-series of electrically unacceptable microelectronic fabrication die may be undertaken by a simple vertical re-registering of the electrical probe head with respect to an electrically unacceptable microelectronic fabrication die through an increase and decrease in vertical separation of the electrical probe head and electrically unacceptable microelectronic fabrication die without any lateral movement of the microelectronic fabrication substrate within which is fabricated the electrically unacceptable microelectronic fabrication die. In the alternative, such repositioning of the electrical probe head with respect to each of the sub-series of electrically unacceptable microelectronic fabrication die may be undertaken employing both a vertical re-registering of the electrical probe head with respect to the electrically unacceptable microelectronic fabrication die and a lateral re-indexing of the microelectronic fabrication substrate within which is fabricated the unacceptable microelectronic fabrication die.

As is understood by a person skilled in the art, within the context of the present invention, a repositioning of an electrical probe head with respect to an electrically unacceptable microelectronic fabrication die provides for greater accuracy when electrical probe retesting the electrically unacceptable microelectronic fabrication die insofar as such repositioning of the electrical probe head with respect to the electrically unacceptable microelectronic fabrication die will typically address electrical probe head probe contact deficiencies and electrical probe head misregistration deficiencies when electrical probe retesting an electrically unacceptable microelectronic fabrication die.

Similarly, and also in accord with the present invention, the present invention preferably provides that none of the electrically acceptable microelectronic fabrication die within the series of microelectronic fabrication die is electrical probe retested, but all of the sub-series of electrically unacceptable microelectronic fabrication die from within the series of microelectronic fabrication die is electrical probe retested.

As is understood by a person skilled in the art, by electrical probe retesting only the series of electrically unacceptable microelectronic fabrication die, but not the series of electrically acceptable microelectronic fabrication die, there is provided enhanced efficiency when electrical probe testing a series of microelectronic fabrication die fabricated within a microelectronic fabrication substrate.

Thus, for reasons as noted above, the method of the present invention as outlined within the algorithmic flow diagram of FIG. 1 provides for both enhanced accuracy and enhanced efficiency when electrical test testing a series of microelectronic fabrication die fabricated within a microelectronic fabrication substrate.

As is further understood by a person skilled in the art, and for exemplary purposes, within the context of the electrical probe testing of the sub-series of electrically unacceptable microelectronic fabrication die within the microelectronic fabrication substrate and the electrical probe retesting of each of the electrically unacceptable microelectronic fabrication die within the sub-series of electrically unacceptable microelectronic fabrication die, there may be determined from the electrical probe testing data a wafer map which in turn may be employed for identifying electrically acceptable die for pick and place (or other) purposes when further fabricating electrically acceptable microelectronic fabrication die parted from a microelectronic fabrication substrate into microelectronic fabrication packages.

Figure 2:
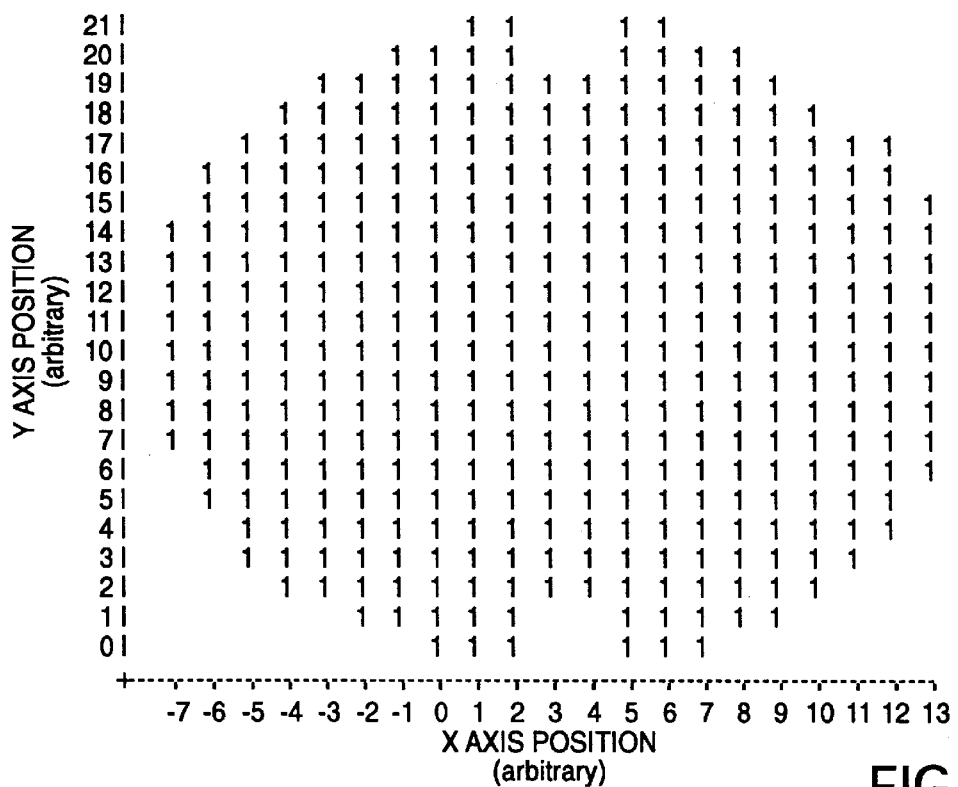
FIG. 2, FIG. 3 and FIG. 4 show a series of semiconductor integrated circuit microelectronic fabrication substrate wafer maps which may be derived in accord with the present invention.
Figure 3:
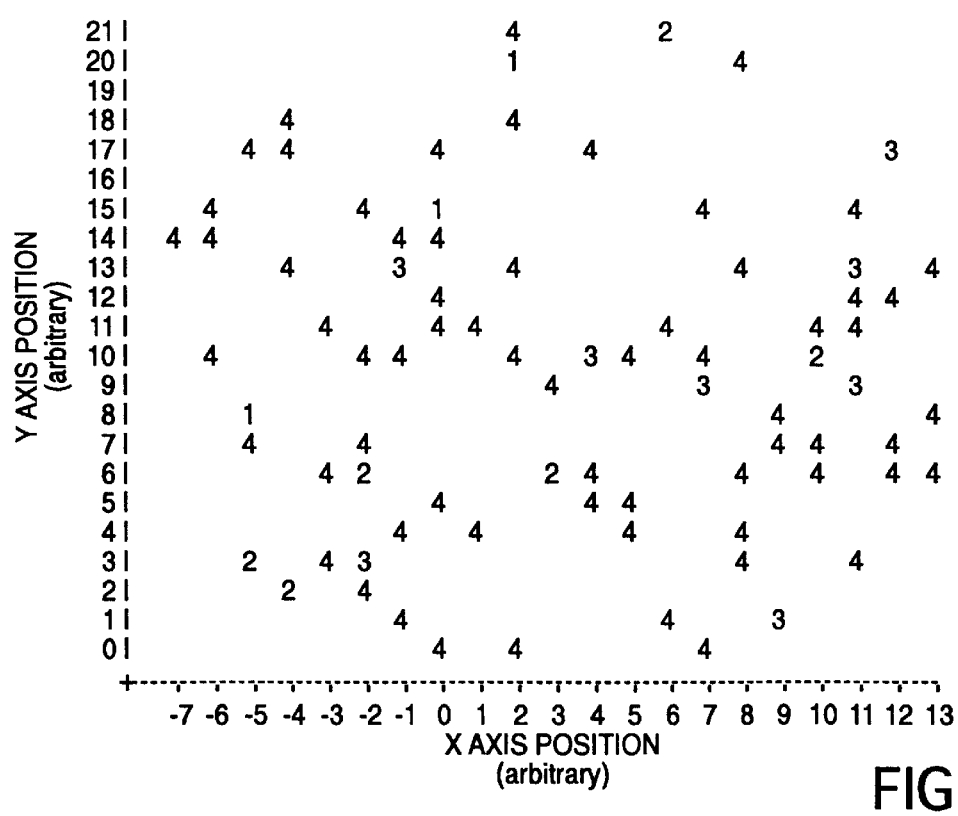
Figure 4:
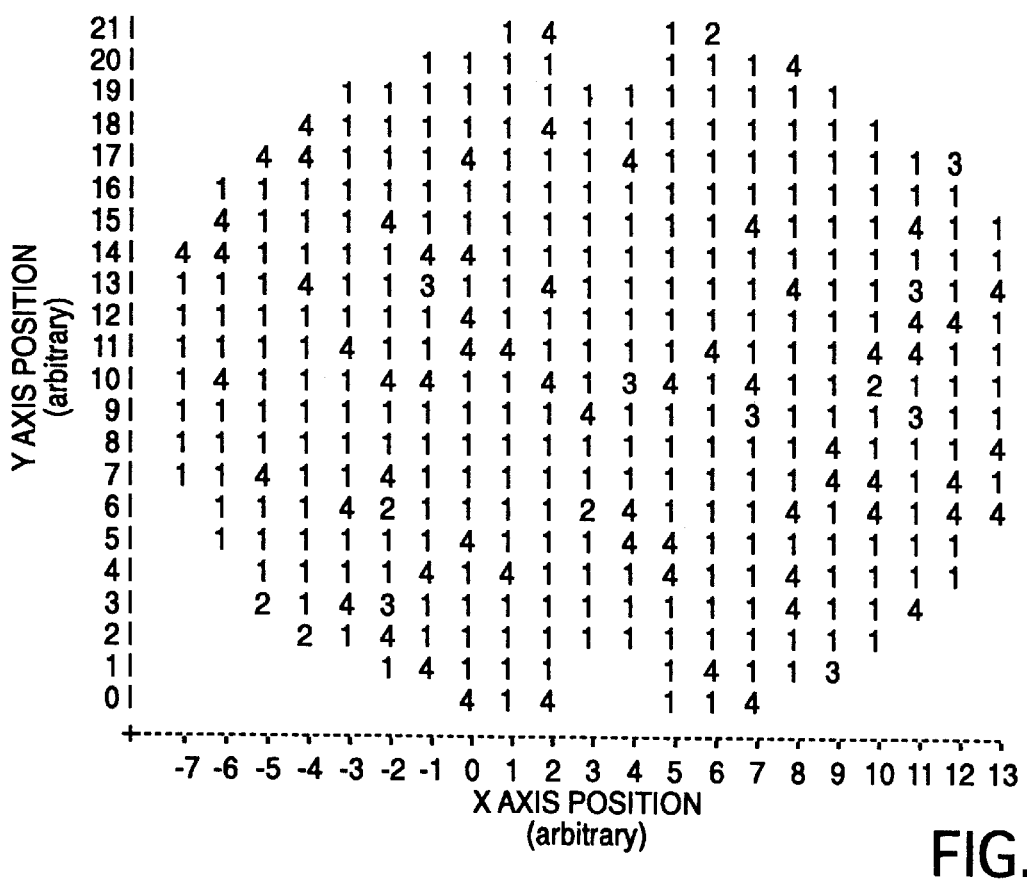

Examples of wafer maps which are applicable within the context of the present invention are shown within the schematic diagrams of FIG. 2 to FIG. 4.

As shown within the schematic diagram of FIG. 2, there is illustrated a wafer map for a semiconductor integrated circuit microelectronic fabrication substrate wafer prior to electrical probe testing. Within the wafer map as illustrated within FIG. 2, a "1" indicates the location of a semiconductor integrated circuit microelectronic fabrication die of assumed electrically acceptable character.

Similarly, within the schematic diagram of FIG. 3, there is illustrated a wafer map which results from electrical probe retesting of only a series of electrically unacceptable semiconductor integrated circuit microelectronic fabrication die within a semiconductor integrated circuit microelectronic fabrication substrate wafer. Within the wafer map whose schematic diagram is illustrated in FIG. 3, there is illustrated electrical probe retest data wherein a "1" again corresponds with an electrically acceptable semiconductor integrated circuit microelectronic fabrication die, an and "2", "3" or "4" corresponds with a semiconductor integrated circuit microelectronic fabrication die of continued electrically unacceptable character. For example and without limitation, and in accord with the above, the "2", "3" or "4" may be further categorized as shorts, opens or leakage current defects within a semiconductor integrated circuit microelectronic fabrication die. Within the wafer map whose schematic diagram is illustrated in FIG. 3, there are electrical probe retested eight two electrically unacceptable semiconductor integrated circuit microelectronic fabrication die of which three (3.7%) were electrical probe retested as electrically acceptable semiconductor integrated circuit microelectronic fabrication die.

Finally, there is shown in FIG. 4 a wafer map which results from the merger of the wafer map whose schematic diagram is illustrated in FIG. 2 with the wafer map whose schematic diagram is illustrated in FIG. 3, where with respect to an individual semiconductor integrated circuit microelectronic fabrication die within the merged wafer map, a designation of "2", "3" or "4" takes precedence over a designation of "1".

As is understood by a person skilled in the art, the method for merging wafer maps as illustrated within the progression of the wafer maps from FIG. 2 to FIG. 4 is desirable in the art of microelectronic fabrication insofar there is no need to record and store within a first electrical probe testing of a series of microelectronic fabrication die fabricated within a microelectronic fabrication substrate the actual electrical probe data, but rather only the location of the electrically unacceptable microelectronic fabrication die.

As is understood by a person skilled in the art, the preferred embodiment and example of the present invention are illustrative of the present invention rather than limiting of the present invention. Revisions and modifications may be made to apparatus and systems which are employed within the context of the preferred embodiment and example of the present invention while still providing a method in accord with the present invention, further in accord with the accompanying claims.

What is claimed is:

1. A method for electrically testing a series of microelectronic fabrication die fabricated within a microelectronic fabrication substrate comprising:

providing a microelectronic fabrication substrate having fabricated therein a series of microelectronic fabrication die;

electrically testing within the microelectronic fabrication substrate the series of microelectronic fabrication die while employing an electrical probe apparatus which sequentially repositions an electrical probe head which accommodates at least one microelectronic fabrication die within the series of microelectronic fabrication die when electrically testing each of the microelectronic fabrication die within the series of microelectronic fabrication die to thus determine from the series of microelectronic fabrication die at least one sub-series of electrically unacceptable microelectronic fabrication die; and electrically retesting the at least one sub-series of electrically unacceptable microelectronic fabrication die after having repositioned the electrical probe head with respect to each microelectronic fabrication die within the at least one sub-series of electrically unacceptable microelectronic fabrication die.

2. The method of claim 1 wherein the microelectronic fabrication substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the electrical probe apparatus is a physical contact electrical probe apparatus.

4. The method of claim 1 wherein the electrical probe apparatus is a physical non-contact electrical probe apparatus.

5. The method of claim 1 wherein the microelectronic fabrication substrate is reindexed prior to electrically retesting an electrically unacceptable die within the at least one sub-series of electrically unacceptable microelectronic fabrication die.

6. The method of claim 1 wherein the microelectronic fabrication substrate is not reindexed prior to electrically retesting an electrically unacceptable die within the at least one sub-series of electrically unacceptable microelectronic fabrication die.

7. The method of claim 1 wherein incident to electrically retesting the sub-series of electrically unacceptable microelectronic fabrication die there is determined a microelectronic fabrication substrate map employed for further fabrication of the series of microelectronic fabrication die.

8. The method of claim 1 wherein only the at least one sub-series of electrically unacceptable microelectronic fabrication die is electrically retested.

9. A method for electrically testing a series of semiconductor integrated circuit microelectronic fabrication die fabricated within a semiconductor integrated circuit microelectronic fabrication substrate wafer comprising:

providing a semiconductor integrated circuit microelectronic fabrication substrate wafer having fabricated therein a series of semiconductor integrated circuit microelectronic fabrication die;

electrically testing within the semiconductor integrated circuit microelectronic fabrication substrate wafer the series of semiconductor integrated circuit microelectronic fabrication die while employing an electrical probe apparatus which sequentially repositions an electrical probe head which accommodates at least one semiconductor integrated circuit microelectronic fabrication die within the series of semiconductor integrated circuit microelectronic fabrication die when electrically testing each of the semiconductor integrated circuit microelectronic fabrication die within the series of semiconductor integrated circuit microelectronic fabrication die to thus determine from the series of semiconductor integrated circuit microelectronic fabrication die at least one sub-series of electrically unacceptable semiconductor integrated circuit microelectronic fabrication die; and electrically retesting the at least one sub-series of electrically unacceptable semiconductor integrated circuit microelectronic fabrication die after having repositioned the electrical probe head with respect to each semiconductor integrated circuit microelectronic fabrication die within the at least one sub-series of electrically unacceptable semiconductor integrated circuit microelectronic fabrication die.

10. The method of claim 9 wherein the electrical probe apparatus is a physical contact electrical probe apparatus.

11. The method of claim 9 wherein the electrical probe apparatus is a physical non-contact electrical probe apparatus.

12. The method of claim 9 wherein the semiconductor integrated circuit microelectronic fabrication substrate wafer is reindexed prior to electrically retesting an electrically unacceptable semiconductor integrated circuit microelectronic fabrication die within the at least one sub-series of electrically unacceptable semiconductor integrated circuit microelectronic fabrication die.

13. The method of claim 9 wherein the semiconductor integrated circuit microelectronic fabrication substrate wafer is not reindexed prior to electrically retesting an electrically unacceptable semiconductor integrated circuit microelectronic fabrication die within the at least one sub-series of electrically unacceptable semiconductor integrated circuit microelectronic fabrication die.

14. The method of claim 9 wherein incident to electrically retesting the sub-series of electrically unacceptable semiconductor integrated circuit microelectronic fabrication die there is determined a semiconductor integrated circuit microelectronic fabrication substrate wafer map employed for further fabrication of the series of semiconductor integrated circuit microelectronic fabrication die.

15. The method of claim 9 wherein only the at least one sub-series of electrically unacceptable semiconductor integrated circuit microelectronic fabrication die is electrically retested.

* * * * *